(12) United States Patent
Bolanos et al.

(10) Patent No.: US 11,031,768 B2
(45) Date of Patent: Jun. 8, 2021

(54) DEVICES INCLUDING TWO CURRENT MONITORS

(71) Applicant: Hewlett-Packard Development Company, L.P., Houston, TX (US)

(72) Inventors: Fernando Bolanos, Boise, ID (US); Wayne Tangen, Meridian, ID (US); Jim Jensen, Boise, ID (US); Robert G Mejia, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 247 days.

(21) Appl. No.: 16/061,936

(22) PCT Filed: Apr. 13, 2016

(86) PCT No.: PCT/US2016/027238
§ 371 (c)(1),
(2) Date: Jun. 13, 2018

(87) PCT Pub. No.: WO2017/180115
PCT Pub. Date: Oct. 19, 2017

(65) Prior Publication Data
US 2018/0366938 A1    Dec. 20, 2018

(51) Int. Cl.
*H02H 3/087*    (2006.01)
*B41J 2/385*    (2006.01)
*G01R 19/165*    (2006.01)
*B41J 29/387*    (2006.01)

(52) U.S. Cl.
CPC .............. *H02H 3/087* (2013.01); *B41J 2/385* (2013.01); *G01R 19/165* (2013.01); *B41J 29/387* (2013.01)

(58) Field of Classification Search
CPC ....... H02H 3/087; H02H 3/093; H02H 3/0935
See application file for complete search history.

(56) References Cited

U.S. PATENT DOCUMENTS

| 5,108,204 A | 4/1992 | Suemune |
| 5,381,296 A | 1/1995 | Ekelund et al. |
| 5,751,532 A * | 5/1998 | Kanuchok ............ H02H 3/0935 361/115 |

(Continued)

FOREIGN PATENT DOCUMENTS

| CN | 102064807 A | 5/2011 |
| CN | 104052259 A | 9/2014 |

(Continued)

OTHER PUBLICATIONS

Raspotnig, Michael—"Electronic fuses to protect 24V DC load circuits"—PULS Application Note—Oct. 2011.Rev. 3-6 pages.

*Primary Examiner* — Peter M Novak
(74) *Attorney, Agent, or Firm* — Dicke Billig & Czaja PLLC

(57) ABSTRACT

A device includes a current sensor, a first current monitor, and a second current monitor. The current sensor is to sense a current between an input node and an output node. The first current monitor is to disconnect the input node from the output node in response to the sensed current exceeding a first threshold current for a period exceeding a threshold period. The second current monitor is to disconnect the input node from the output node in response to the sensed current exceeding a second threshold current greater than the first threshold current.

17 Claims, 5 Drawing Sheets

(56) References Cited

U.S. PATENT DOCUMENTS

| | | | |
|---|---|---|---|
| 5,764,463 A | 6/1998 | Arvidson et al. | |
| 6,127,882 A | 10/2000 | Vargha et al. | |
| 6,392,446 B1 | 5/2002 | Reasoner et al. | |
| 6,600,641 B2 | 7/2003 | Oglesbee et al. | |
| 8,022,976 B2 | 9/2011 | Lund et al. | |
| 2005/0242779 A1* | 11/2005 | Yoshio | B60L 58/21 |
| | | | 320/134 |
| 2006/0209116 A1* | 9/2006 | Tanaka | B41J 29/393 |
| | | | 347/19 |
| 2007/0126770 A1 | 6/2007 | Asauchi | |
| 2008/0212246 A1* | 9/2008 | Tanaka | G01R 31/50 |
| | | | 361/86 |
| 2011/0110009 A1* | 5/2011 | Sugimoto | H03K 17/0822 |
| | | | 361/93.1 |
| 2012/0299393 A1* | 11/2012 | Hafner | H01H 9/548 |
| | | | 307/113 |
| 2014/0210897 A1 | 7/2014 | Koehler et al. | |
| 2015/0092311 A1* | 4/2015 | Wang | H02H 1/043 |
| | | | 361/86 |
| 2015/0310320 A1 | 10/2015 | Yamaguchi | |
| 2016/0087422 A1* | 3/2016 | Mourrier | H02H 7/0844 |
| | | | 361/86 |
| 2017/0354047 A1* | 12/2017 | Okura | H05K 5/006 |

FOREIGN PATENT DOCUMENTS

| | | |
|---|---|---|
| CN | 105375796 A | 3/2016 |
| EP | 1564077 | 8/2005 |
| JP | H04-312314 | 11/1992 |
| JP | 2002-354797 | 12/2002 |
| JP | 2007-212528 | 8/2007 |
| JP | 2013-128343 | 6/2013 |
| JP | 2014-010660 | 1/2014 |
| JP | 2015-208917 | 11/2015 |

* cited by examiner

DEVICES INCLUDING TWO CURRENT MONITORS

BACKGROUND

Multifunction printers may include an integrated scanner assembly (ISA) that receives power from a printer power supply. The printer may be a laser printer, an inkjet printer, or another suitable printer. The ISA may include an automatic document feeder (ADF). Multiple voltages may be used to power the various components of a multifunction printer.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

While the following description equates a logic high signal to an asserted signal and a logic low signal to a signal that is not asserted, in other examples the logic levels may be reversed such that a logic low signal may be equated to an asserted signal and a logic high signal to a signal that is not asserted.

Multifunction printers may include an integrated scanner assembly (ISA) that receives power from a printer power supply. The ISA may be housed in fire-retardant plastics such that there is no safety requirement to limit power delivered by the power supply to the ISA. To reduce the cost of ISAs, however, the ISAs may be housed in non-fire retardant plastics. This forces the printer to have a protection device that will either limit the current or turn off the power to the ISA in response to overcurrent events. Overcurrent events include currents beyond normal peak currents. In addition, to comply with safety requirements from the regulatory agency UL, power exceeding 100 watts for periods greater than 5 seconds may not be supplied to the ISA. However, the ISA uses more than 100 watts of power for short periods (e.g., 10 ms). Further, the ISA should be protected from short circuits.

Accordingly, a protection circuit is disclosed herein to satisfy the power needs of the ISA while meeting the safety requirements. The protection circuit includes a first current monitor to disconnect power to the ISA prior to power exceeding 100 watts for 5 seconds being supplied to the ISA. The protection circuit also includes a second current monitor to disconnect the power to the ISA in response to sensing a short circuit or other overcurrent event.

Figure 1:
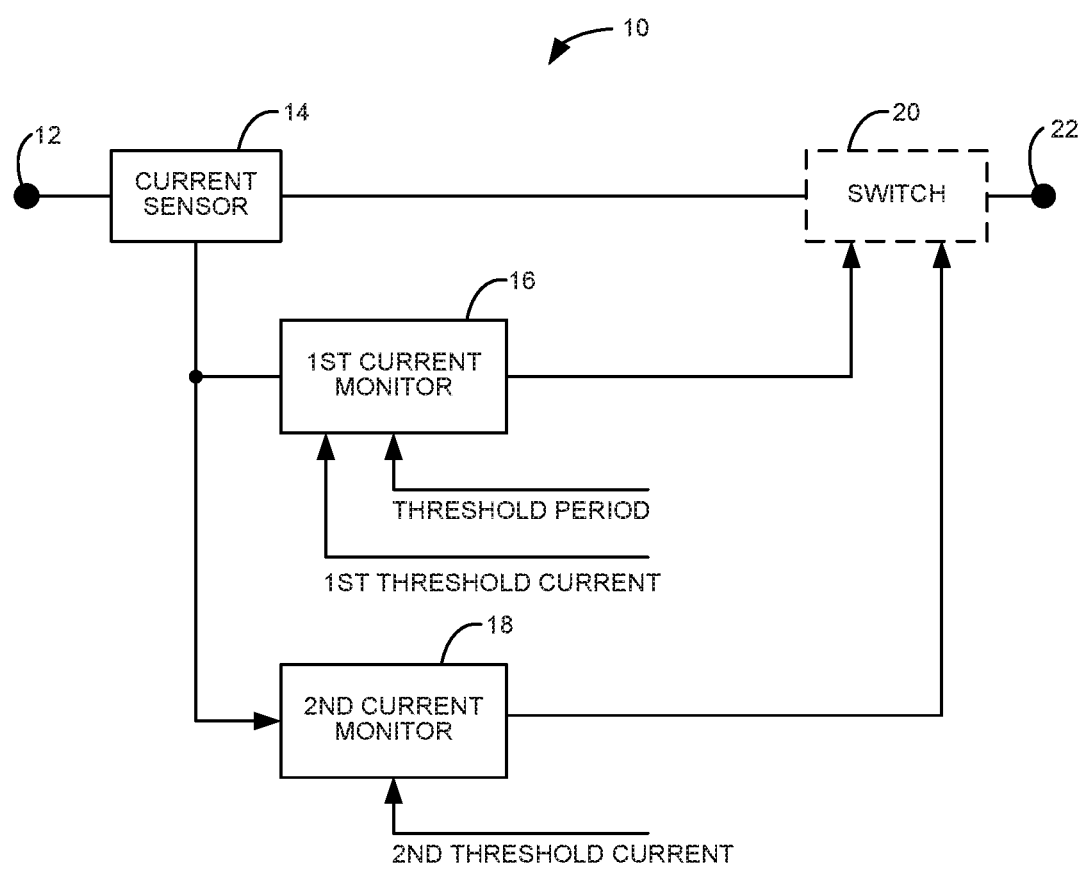
FIG. 1 is a schematic diagram illustrating one example of a power protection circuit.

FIG. 1 is a schematic diagram illustrating one example of a power protection circuit 10. Power protection circuit 10 includes a current sensor 14, a first current monitor 16, and a second current monitor 18. Current sensor 14 is to sense a current between an input node 12 and an output node 22. First current monitor 16 is to disconnect (e.g., via switch 20) the input node from the output node in response to the sensed current exceeding a first threshold current for a period exceeding a threshold period. Second current monitor 18 is to disconnect (e.g., via switch 20) the input node from the output node in response to the sensed current exceeding a second threshold current greater than the first threshold current.

Figure 1A:
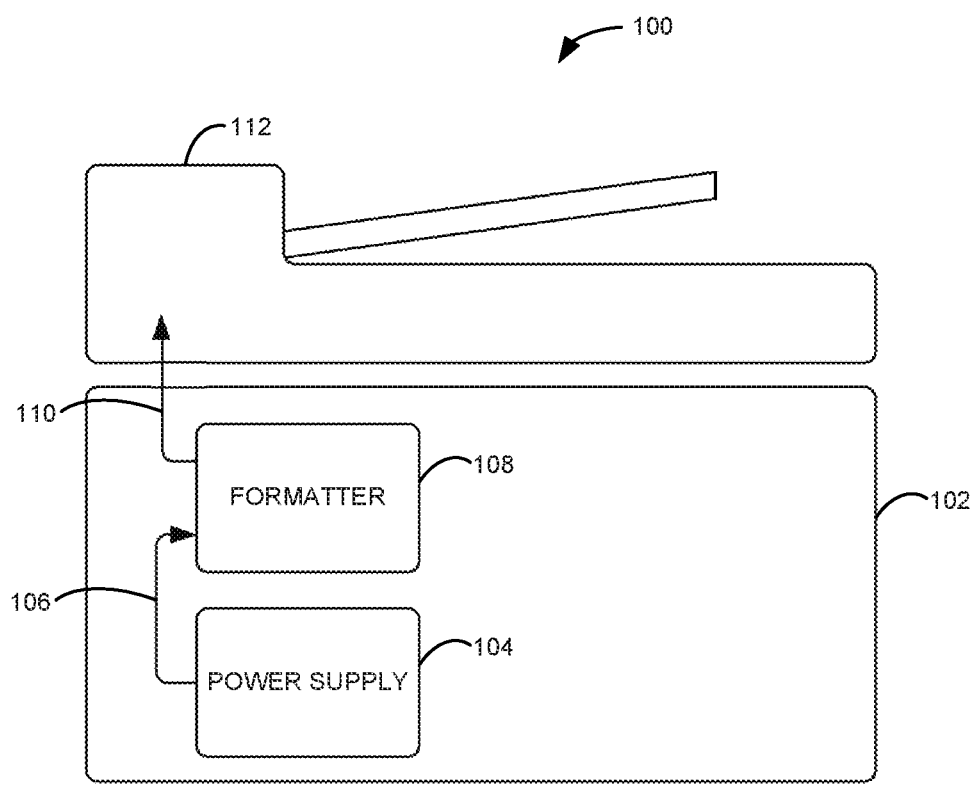
FIG. 1A illustrates one example of a multifunction printer including an integrated scanner assembly (ISA).

FIG. 1A illustrates one example of a multifunction printer 100. Multifunction printer 100 includes a printer 102 and an ISA 112. Printer 102 may be a laser printer, an inkjet printer, or another suitable printer. ISA 112 may include an automatic document feeder (ADF) including at least one DC motor. Printer 102 may be housed in fire retardant plastics while ISA 112 may be housed in non-fire retardant plastics.

Printer 102 includes a power supply 104 and a formatter 108 (e.g., a printed circuit assembly). Power supply 104 is electrically coupled to formatter 108 through a power path 106. Formatter 108 is electrically coupled to ISA 112 through a power path 110. Power supply 104 supplies power to printer 102 and to formatter 108. In one example, formatter 108 supplies power to ISA 112. In another example, a printed circuit assembly, such as an inter-connect board, supplies power to ISA 112. In one example, ISA 112 uses a lower power voltage (e.g., 5.1V) for control and image processing and a higher power voltage (e.g., 24V or 33V) for motors. The lower power voltage may be protected by a UL approved resettable fuse. The higher power voltage, however, is protected by a circuit of formatter 108 as described herein.

Power supply 104 may receive alternating current (AC) line power and convert the AC line power to provide direct current (DC) power for operating multifunction printer 100. Power supply 104 may receive AC power having a voltage between 110V and 120V, between 220V and 240V, or between other suitable voltages. Power supply 104 includes at least one AC to DC converter to provide DC power having a voltage of 5V, 12V, 24V, 33V, and/or other suitable voltages for operating multifunction printer 100. In one example, power supply 104 provides 24 VDC to formatter 108. In another example, power supply 104 provides 33 VDC to formatter 108. In other examples, power supply 104 provides another suitable voltage to formatter 108.

Formatter 108 supplies power to ISA 112 for operating ISA 112. At the same time, formatter 108 ensures that the power supplied to ISA 112 remains within safety and regulatory requirements. In addition, formatter 108 reduces costs by reducing warranty repairs by protecting a fuse from blowing in the formatter, which may require replacement of the formatter. ISA 112 uses the most power at ADF paper pickup when DC motors start. In one example, ISA 112 may reach peak power pulses of 105.6 W with a time duration of 10 ms each. Thus, from the standpoint of power consumption there is an overlap. On one hand, ISA 112 uses more than 100 W of power for periods of 10 ms. On the other hand, to meet safety requirements, the power should be limited to less than 100 W within 5 seconds of having reached 100 W.

Figure 2:
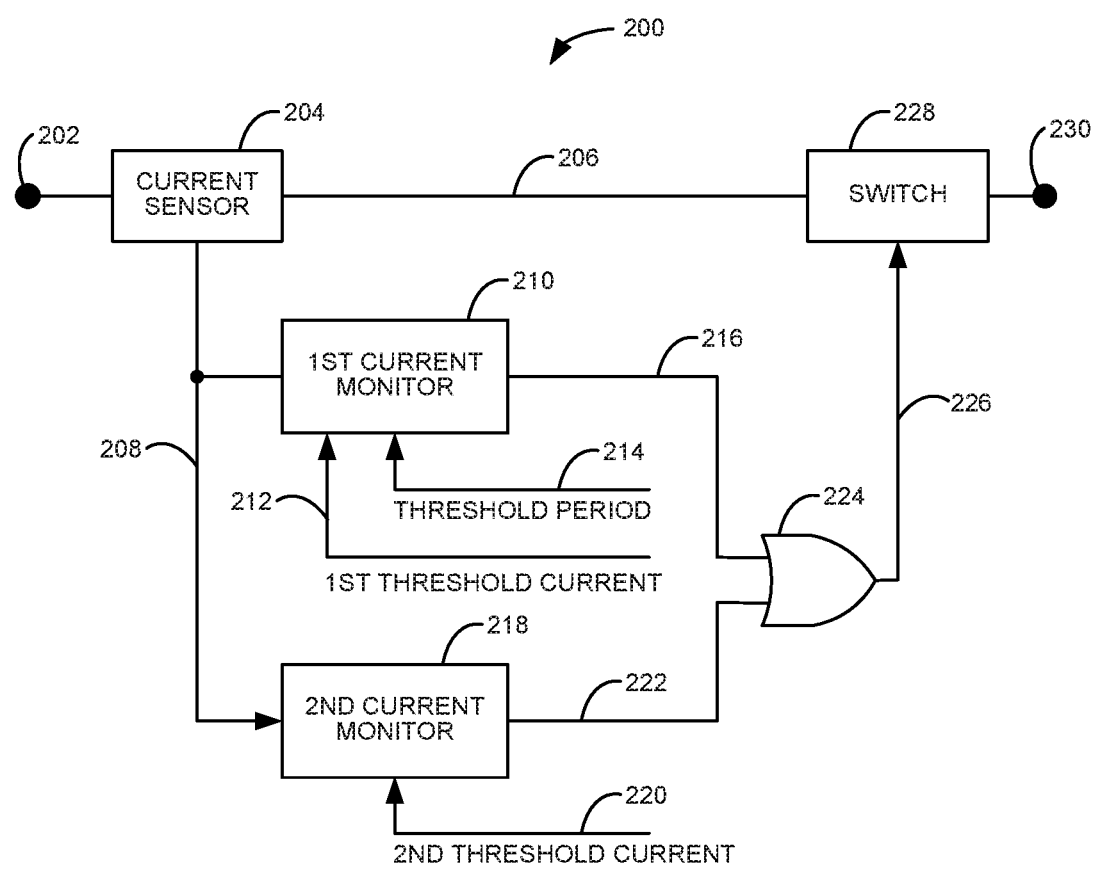
FIG. 2 is a schematic diagram illustrating one example of a power protection circuit for an ISA.

FIG. 2 is a schematic diagram illustrating one example of a power protection circuit 200 of a formatter, such as formatter 108 previously described and illustrated with reference to FIG. 1A. Power protection circuit 200 includes an input node 202, a current sensor 204, a first current monitor 210, a second current monitor 218, an OR gate 224, a switch 228, and an output node 230. Input node 202 receives DC power from power supply 104 through signal path 106 as previously described and illustrated with reference to FIG. 1A. Current sensor 204 is electrically coupled between input node 202 and a power path 206. Switch 228 is electrically coupled between power path 206 and output node 230. Output node 230 provides DC power to ISA 112 through power path 110 as previously described and illustrated with reference to FIG. 1A.

The output of current sensor 204 is electrically coupled to a first input of first current monitor 210 and a first input of second current sensor 218 through a signal path 208. A second input of first current monitor 210 receives a first threshold current through a signal path 212. A third input of first current monitor 210 receives a threshold period through a signal path 214. The output of first current monitor 210 is electrically coupled to a first input of OR gate 224 through a signal path 216. A second input of second current monitor 218 receives a second threshold current through a signal path 220. The output of second current monitor 218 is electrically coupled to a second input of OR gate 224 through a signal path 222. The output of OR gate 224 is electrically coupled to a control input of switch 228 through a signal path 226.

Current sensor 204 senses the current between input node 202 and switch 228. With switch 228 closed to pass power on input node 202 to output node 230, current sensor 204 senses the current drawn by the ISA coupled to output node 230. Current sensor 204 provides the sensed current to first current monitor 210 and second current monitor 218 through signal path 208.

First current monitor 210 compares the sensed current on signal path 208 to the first threshold current on signal path 212. In response to the sensed current being less than the first threshold current, first current monitor 210 outputs a logic low signal on signal path 216. In response to the sensed current being greater than the first threshold current for a period less than the threshold period on signal path 214, first current monitor 210 output a logic low signal on signal path 216. In response to the sensed current being greater than the first threshold current for a period exceeding the threshold period, first current monitor 210 output a logic high signal (i.e., asserts the signal) on signal path 216. Accordingly, the signal on signal path 216 remains logic low unless first current monitor 210 asserts the signal in response to the sensed current exceeding the first threshold current for a period exceeding the threshold period. In one example, the first threshold current is set to indicate power being supplied to the ISA exceeding 100 watts and the threshold period is set to 5 seconds or less.

Second current monitor 218 compares the sensed current on signal path 208 to the second threshold current on signal path 220. The second threshold current is greater than the first threshold current. In one example, the second current threshold is set to a value indicating a short circuit or other overcurrent event. In response to the sensed current being less than the second threshold current, second current monitor 218 outputs a logic low signal on signal path 222. In response to the sensed current being greater than the second threshold current, second current monitor 218 output a logic high signal (i.e., asserts the signal) on signal path 222. Accordingly, the signal on signal path 222 remains logic low unless second current monitor 218 asserts the signal in response to the sensed current exceeding the second threshold current. In one example, second current monitor 218 asserts the signal on signal path 222 within 100 microseconds of the sensed current exceeding the second threshold current.

OR gate 224 receives the output signal from first current monitor 210 through signal path 216 and the output signal from second current monitor 218 through signal path 222. In response to both the signal on signal path 216 and the signal on signal path 222 being logic low, OR gate 224 outputs a logic low signal on signal path 226. In response to the signal on signal path 216 or the signal on signal path 222 being logic high, OR gate 224 outputs a logic high signal on signal path 226.

Switch 228 is controlled by the output signal from OR gate 224 on signal path 226. In response to a logic low signal on signal path 226, switch 228 is closed to pass the power on input node 202 to output node 230. In response to a logic high signal on signal path 226, switch 228 is opened to block the power on input node 202 from passing to output node 230. Accordingly, switch 228 disconnects input node 202 from output node 230 in response to the output signal from first current monitor 210 or the output signal from second current monitor 218 being asserted.

In one example, 24V DC power is supplied to input node 202. In this example, the first threshold current may be set to about 3.7 A, the threshold period may be set to about 250 ms, and the second threshold current may be set to about 6 A. Thus, switch 228 will disconnect input node 202 from output node 230 in response to first current monitor 210 asserting the signal on signal path 216 in response to the power on signal path 206 exceeding about 100 W for more than about 250 ms. This is within the 5 second requirement of the safety regulation while enabling the power to exceed 100 W for short periods (i.e., less than 250 ms), such as when the DC motors of the ADF start. Switch 228 will also disconnect input node 202 from output node 230 in response to second current monitor 218 asserting the signal on signal path 222 in response to the power on signal path 206 exceeding about 150 W. This power level is outside the operating parameters of the ISA, thereby indicating a short circuit or other improper current draw or malfunction.

In another example, 33V DC power is supplied to input node 202. In this example, the first threshold current may be set to about 2.9 A, the threshold period may be set to about 1 second, and the second threshold current may be set to about 6 A. Thus, switch 228 will disconnect input node 202 from output node 230 in response to first current monitor 210 asserting the signal on signal path 216 in response to the power on signal path 206 exceeding about 100 W for more than about 1 second. This is within the 5 second requirement of the safety regulation while enabling the power to exceed 100 W for short periods (i.e., less than 1 second), such as when the DC motors of the ADF start. Switch 228 will also disconnect input node 202 from output node 230 in response to second current monitor 218 asserting the signal on signal path 222 in response to the power on signal path 206 exceeding about 200 W. This power level is outside the operating parameters of the ISA, thereby indicating a short circuit or other improper current draw or malfunction.

Figure 3:
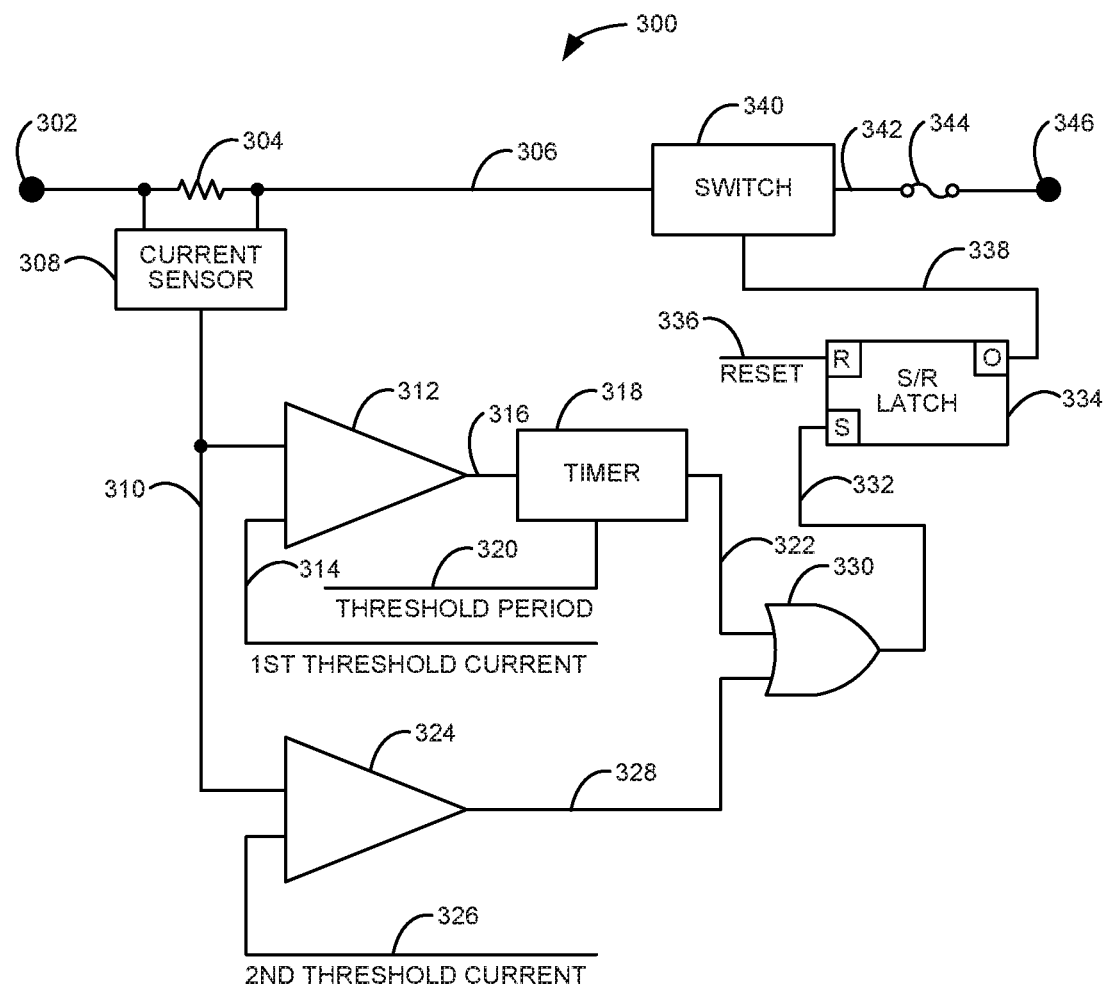
FIG. 3 is a schematic diagram illustrating another example of a power protection circuit for an ISA.

FIG. 3 is a schematic diagram illustrating another example of a power protection circuit 300 of a formatter, such as formatter 108 previously described and illustrated with reference to FIG. 1A. Power protection circuit 300 includes an input node 302, a sense resistor 304, a current sensor 308, a first current monitor including a first comparator 312 and a timer 318, a second current monitor including a second comparator 324, an OR gate 330, a set/reset (S/R) latch 334, a switch 340, a fuse 344, and an output node 346. Input node 302 receives DC power from power supply 104 through signal path 106 as previously described and illustrated with reference to FIG. 1A. Sense resistor 304 is electrically coupled between input node 302 and a power path 306. Switch 340 is electrically coupled between power path 306 and a power path 342. Fuse 344 is electrically coupled between power path 342 and output node 346. Output node 346 provides DC power to ISA 112 through power path 110 as previously described and illustrated with reference to FIG. 1A.

A first input of current sensor 308 is electrically coupled to one side of sense resistor 304, and a second input of current sensor 308 is electrically coupled to the other side of sense resistor 304. The output of current sensor 308 is electrically coupled to a first input of first comparator 312 and a first input of second comparator 324 through a signal path 310. A second input of first comparator 312 receives a first threshold current through a signal path 314. The output of first comparator 312 is electrically coupled to a first input of timer 318 through a signal path 316. A second input of timer 318 receives a threshold period through a signal path 320. The output of timer 318 is electrically coupled to a first input of OR gate 330 through a signal path 322. A second input of second comparator 324 receives a second threshold current through a signal path 326. The output of second comparator 324 is electrically coupled to a second input of OR gate 330 through a signal path 328. The output of OR gate 330 is electrically coupled to the set input of S/R latch 334 through a signal path 332. The reset input of S/R latch 334 receives a reset signal through a signal path 336. The output of S/R latch 334 is electrically coupled to the control input of switch 340 through a signal path 338.

Current sensor 308 senses the current through sense resistor 304 based on the voltage drop across sense resistor 304 and the resistance of sense resistor 304. The current through sense resistor 304 represents the current between input node 302 and switch 340. With fuse 344 not blown and switch 340 closed to pass power on input node 302 to output node 346, current sensor 308 senses the current drawn by the ISA coupled to output node 346. Current sensor 308 provides the sensed current to first comparator 312 and second comparator 324 through signal path 310.

First comparator 312 compares the sensed current on signal path 310 to the first threshold current on signal path 314. In response to the sensed current being less than the first threshold current, first comparator 312 outputs a logic low signal on signal path 316. In response to the sensed current being greater than the first threshold current, first comparator 312 output a logic high signal (i.e., asserts the signal) on signal path 316. Timer 318 starts timing in response to first comparator 312 asserting the signal on signal path 316. In response to the signal on signal path 316 remaining asserted for a period exceeding the threshold period, timer 318 outputs a logic high (i.e., asserts the signal) on signal path 322. In response to the signal on signal path 316 transitioning back to logic low prior to timer 318 exceeding the threshold period, timer 318 resets. Accordingly, the signal on signal path 322 remains logic low unless first comparator 312 and timer 318 assert the signal in response to the sensed current exceeding the first threshold current for a period exceeding the threshold period. In one example, the first threshold current is set to indicate power being supplied to the ISA exceeding 100 watts and the threshold period is set to 5 seconds or less.

Second comparator 324 compares the sensed current on signal path 310 to the second threshold current on signal path 326. The second threshold current is greater than the first threshold current. In one example, the second current threshold is set to a value indicating a short circuit or other overcurrent event. In response to the sensed current being less than the second threshold current, second comparator 324 outputs a logic low signal on signal path 328. In response to the sensed current being greater than the second threshold current, second comparator 324 output a logic high signal (i.e., asserts the signal) on signal path 328. Accordingly, the signal on signal path 328 remains logic low unless second comparator 324 asserts the signal in response to the sensed current exceeding the second threshold current. In one example, second comparator 324 asserts the signal on signal path 328 within 100 microseconds of the sensed current exceeding the second threshold current.

OR gate 330 receives the output signal from timer 318 through signal path 322 and the output signal from second comparator 324 through signal path 328. In response to both the signal on signal path 322 and the signal on signal path 328 being logic low, OR gate 330 outputs a logic low signal on signal path 332. In response to the signal on signal path 322 or the signal on signal path 328 being logic high, OR gate 330 outputs a logic high signal on signal path 332.

S/R latch 334 is set in response to the signal on signal path 332 being asserted and reset in response to the reset signal on signal path 336 being asserted. Therefore, S/R latch 334 provides a logic high signal (i.e., asserts the signal) on signal path 338 in response to a logic high signal on signal path 332. S/R latch 334 maintains the logic high signal on signal path 338 until a logic high signal is received on signal path 336. In one example, the reset signal on signal path 336 is asserted by a controller or another logic circuit once the conditions that resulted in S/R latch 334 being set are resolved. In another example, the reset signal on signal path 336 is asserted in response to a power cycle event.

Switch 340 is controlled by the output signal from S/R latch 334 on signal path 338. In response to a logic low signal on signal path 338, switch 340 is closed to pass the power on input node 302 to fuse 344. In response to a logic high signal on signal path 338, switch 340 is opened to block the power on input node 302 from passing to fuse 344. Accordingly, switch 340 disconnects input node 302 from fuse 344 in response to the output signal from timer 318 or the output signal from second comparator 324 being asserted.

Fuse 344 passes the power on signal path 342 to output node 346. Fuse 344 is sized based on the voltage supplied to input node 302. In one example, the second threshold current is set such that second comparator 324 opens switch 340 prior to fuse 344 blowing. Thus, warranty costs for replacing fuse 344 or warranty costs for replacing the circuit board on which fuse 344 is installed are avoided.

Figure 4:
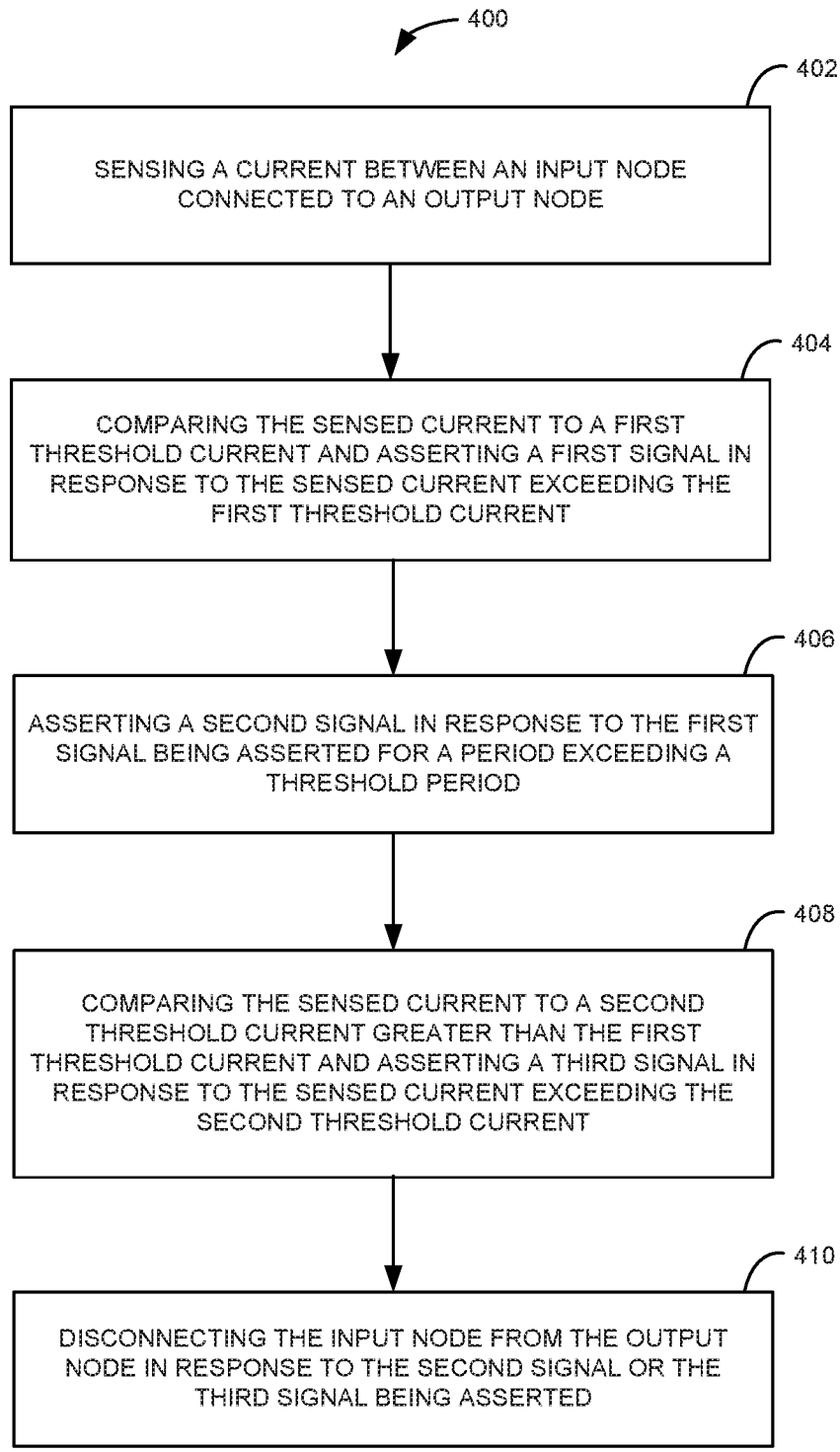
FIG. 4 is a flow diagram illustrating one example of a method for limiting power supplied to an ISA.

FIG. 4 is a flow diagram illustrating one example of a method 400 for limiting power supplied to an ISA. At 402, method 400 includes sensing a current between an input node connected to an output node. At 404, method 400 includes comparing the sensed current to a first threshold current and asserting a first signal in response to the sensed current exceeding the first threshold current. At 406, method 400 includes asserting a second signal in response to the first signal being asserted for a period exceeding a threshold period. At 408, method 400 includes comparing the sensed current to a second threshold current greater than the first threshold current and asserting a third signal in response to the sensed current exceeding the second threshold current. At 410, method 400 includes disconnecting the input node from the output node in response to the second signal or the third signal being asserted.

The first threshold current may correspond to a power at the output node exceeding 100 watts. In one example, the threshold period is less than 5 seconds. The second threshold current may correspond to a power at the output node indicating a short circuit. In one example, method 400 may also include reconnecting the input node to the output node in response to a reset event or a power cycle event.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A device comprising:
   a current sensor to sense a DC current between an input node and an output node;
   a switch between the input node and the output node;
   a first current monitor to disconnect the input node from the output node by opening the switch in response to the sensed DC current exceeding a first threshold current for a period exceeding a threshold period;
   a second current monitor to disconnect the input node from the output node by opening the switch in response to the sensed DC current exceeding a second threshold current greater than the first threshold current;
   a fuse in series with the switch and between the switch and the output node,
   wherein the first current monitor and the second current monitor are to disconnect the input node from the output node by opening the switch to prevent the fuse from being blown; and
   a set/reset latch comprising a set input coupled to the first current monitor and the second current monitor and an output directly coupled to a control input of the switch.

2. The device of claim 1,
   wherein the first current monitor comprises a first comparator to assert a first signal at an output of the first comparator in response to the sensed DC current applied to a first input of the first comparator exceeding the first threshold current applied to a second input of the first comparator and a timer to assert a second signal at an output of the timer in response to the first signal being asserted at a first input of the timer for a period exceeding the threshold period applied to a second input of the timer;
   wherein the second current monitor comprises a second comparator to assert a third signal at an output of the second comparator in response to the sensed DC current applied to a first input of the second comparator exceeding the second threshold current applied to a second input of the second comparator; and
   wherein the switch is to disconnect the input node from the output node in response to the second signal at the output of the timer or the third signal at the output of the second comparator being asserted.

3. The device of claim 1, wherein the sensed DC current is indicative of power at the output node, and wherein the first threshold current and the threshold period are set such that the first current monitor is to disconnect the input node from the output node prior to power at the output node, as indicated by the sensed DC current, exceeding 100 watts for 5 seconds.

4. The device of claim 1, wherein the second threshold current is set to a value indicating an overcurrent event.

5. The device of claim 1, wherein the second current monitor is to disconnect the input node from the output node within 100 microseconds of the sensed current exceeding the second threshold current.

6. The device of claim 1, further comprising:
   a DC motor,
   wherein the first current monitor and the second current monitor are to disconnect the input node from the output node by opening the switch to protect the DC motor from an overcurrent event.

7. A multifunction device comprising:
   a printer comprising a DC power supply electrically coupled to an input node of a printed circuit assembly; and
   an integrated scanner assembly electrically coupled to an output node of the printed circuit assembly, the integrated scanner assembly comprising a DC motor,
   wherein the printed circuit assembly comprises:
   a current sensor to sense a DC current between the input node and the output node;
   a switch between the input node and the output node;
   a first current monitor to disconnect the input node from the output node by opening the switch in response to the sensed DC current exceeding a first threshold current for a period exceeding a threshold period;
   a second current monitor to disconnect the input node from the output node by opening the switch in response to the sensed DC current exceeding a second threshold current greater than the first threshold current;
   a fuse in series with the switch and between the switch and the output node, wherein the first current monitor and the second current monitor are to disconnect the input node from the output node by opening the switch to prevent the fuse from being blown and to protect the integrated scanner assembly comprising the DC motor from overcurrent events; and
   a set/reset latch comprising a set input coupled to the first current monitor and the second current monitor and an output directly coupled to a control input of the switch.

8. The device of claim 7, wherein the sensed DC current is indicative of power at the output node, and wherein the first current monitor is to disconnect the input node from the output node prior to power at the output node, as indicated by the sensed DC current, exceeding 100 watts for 5 seconds.

9. The device of claim 7, wherein the sensed DC current is indicative of power at the output node, and wherein the second current monitor is to disconnect the input node from the output node in response to power at the output node, as indicated by the sensed DC current, indicating a short circuit.

10. The device of claim 7, wherein the integrated scanner assembly comprises a non-fire retardant housing.

11. The multifunction device of claim 7,
   wherein the first current monitor comprises a first comparator to assert a first signal at an output of the first comparator in response to the sensed DC current applied to a first input of the first comparator exceeding the first threshold current applied to a second input of the first comparator and a timer to assert a second signal at an output of the timer in response to the first signal being asserted at a first input of the timer for a period exceeding the threshold period applied to a second input of the timer;

wherein the second current monitor comprises a second comparator to assert a third signal at an output of the second comparator in response to the sensed DC current applied to a first input of the second comparator exceeding the second threshold current applied to a second input of the second comparator; and wherein the switch is to disconnect the input node from the output node in response to the second signal at the output of the timer or the third signal at the output of the second comparator being asserted.

12. A method comprising:

sensing a DC current between an input node connected to an output node;

comparing the sensed DC current to a first threshold current and asserting a first signal in response to the sensed DC current exceeding the first threshold current;

asserting a second signal in response to the first signal being asserted for a period exceeding a threshold period;

comparing the sensed DC current to a second threshold current greater than the first threshold current and asserting a third signal in response to the sensed DC current exceeding the second threshold current; and disconnecting the input node from the output node in response to the second signal or the third signal being asserted by opening a switch between the input node and the output node, wherein disconnecting the input node from the output node prevents a fuse in series with the switch and between the switch and the output node from being blown; and wherein disconnecting the input node from the output node comprises setting a set/reset latch in response to the second signal or the third signal being asserted, the set/reset latch comprising an output directly coupled to a control input of the switch.

13. The method of claim 12, wherein the first threshold current corresponds to a power at the output node exceeding 100 watts.

14. The method of claim 12, wherein the threshold period is less than 5 seconds.

15. The method of claim 12, wherein the second threshold current corresponds to a power at the output node indicating a short circuit.

16. The method of claim 12, further comprising:

reconnecting the input node to the output node in response to a reset event or a power cycle event.

17. The method of claim 12, further comprising:

operating an integrated scanner assembly electrically coupled to the output node, the integrated scanner assembly comprising a DC motor, wherein disconnecting the input node from the output node protects the integrated scanner assembly comprising the DC motor from an overcurrent event.

\* \* \* \* \*